United States Patent
Feng et al.

(10) Patent No.: US 9,147,025 B2
(45) Date of Patent: Sep. 29, 2015

(54) METHOD FOR EFFICIENT FPGA PACKING

(71) Applicant: Microsemi SoC Corporation, San Jose, CA (US)

(72) Inventors: Wenyi Feng, Sunnyvale, CA (US); Jonathan Greene, Palo Alto, CA (US); Kristofer Vorwerk, Kitchener (CA); Val Pevzner, San Jose, CA (US); Arunangshu Kundu, San Jose, CA (US)

(73) Assignee: Microsemi SoC Corporation, San Jose, CA (US)

( * ) Notice: Subject to any disclaimer, the term of this patent is extended or adjusted under 35 U.S.C. 154(b) by 0 days.

(21) Appl. No.: 14/327,842

(22) Filed: Jul. 10, 2014

(65) Prior Publication Data

US 2015/0020038 A1  Jan. 15, 2015

Related U.S. Application Data

(60) Provisional application No. 61/844,524, filed on Jul. 10, 2013.

(51) Int. Cl.
G06F 17/50 (2006.01)

(52) U.S. Cl.
CPC ........ *G06F 17/5054* (2013.01); *G06F 17/5072* (2013.01)

(58) Field of Classification Search
None
See application file for complete search history.

(56) References Cited

U.S. PATENT DOCUMENTS

| | | | |
|---|---|---|---|
| 7,210,112 B2* | 4/2007 | DeHon et al. | 716/121 |
| 7,506,297 B2* | 3/2009 | Mukherjee et al. | 716/104 |
| 7,707,532 B1* | 4/2010 | Padalia et al. | 716/119 |
| 8,006,215 B1* | 8/2011 | Singh | 716/125 |
| 8,281,297 B2* | 10/2012 | Dasu et al. | 717/161 |
| 2007/0245281 A1* | 10/2007 | Riepe et al. | 716/9 |
| 2015/0007120 A1* | 1/2015 | Erickson | 716/105 |

OTHER PUBLICATIONS

Yang et al., "Wirelength Estimation based on Rent Exponents of Partitioning and Placement," SLIP'01, 2001 ACM, pp. 25-31.*
Tom et al., "Un/DoPack: Re-Clustering of Large System-on-Chip Designs with Interconnect Variation for Low-Cost FPGAs," ICCAD'06, 2006 ACM, pp. 680-687.*
Cong et al., "FlowMap: An Optimal Technology Mapping Algorithm for Delay Optimization in Lookup-Table Based FPGA Designs," IEEE Trans. on CAD of ICs and Systems, vol. 13, No. 1, Jan. 1994, pp. 1-12.*
Singh et al., "Efficient Clustering for Area and Power Reduction in FPGAs," FPGA'02, 2002 ACM, pp. 59-66.*
Sanchis, "Multiple-Way Network Partitioning," IEEE Trans on Computers, vol. 38, No. 1, Jan. 1989, pp. 62-81.*

(Continued)

*Primary Examiner* — Leigh Garbowski
(74) *Attorney, Agent, or Firm* — Leech Tishman Fuscaldo & Lampl; Kenneth D'Alessandro, Esq.

(57) ABSTRACT

A method for programming a cluster-based field programmable gate array (FPGA) device includes providing a netlist and cluster size information, translating the netlist into a hypergraph, partitioning the hypergraph into multiple partitions and optimizing the Rent characteristic, translating the partitions into clusters, placing the clusters on the FPGA device, routing interconnects using a pre-fabricated routing resource on the FPGA device, generating a programming bitstream in response to the placing and routing, and providing the programming bitstream to the FPGA device to realize the user design.

5 Claims, 5 Drawing Sheets

(56) References Cited

OTHER PUBLICATIONS

Marrakchi et al., "Hierarchical FPGA clustering based on multilevel partitioning approach to improve routability and reduce power dissipation," Proc. of the 2005 Int'l Conference on Reconfigurable Computing and FPGAs, 4 pages.*

Betz et al., "VPR: A New Packing, Placement and Routing Tool for FPGA Research," 1997 Int'l Workshop on Field Programmable Logic and Applications, pp. 213-222.*

Lam et al., "An Analytical Model Describing the Relationships Between Logic Architecture and FPGA Density," 2008 IEEE, pp. 221-226.*

Karypis et al., "Multilevel k-way Hypergraph Partitioning," 1999 ACM Design Automation Conference, 6 pages.*

Greene et al., "A 65nm Flash-Based FPGA Fabric Optimized for Low Cost and Power," 2011 ACM, pp. 87-95.*

Dambre et al., "A Comparison of Various Terminal-Gate Relationships for Interconnect Prediction in VLSI Circuits," IEEE Trans. on VLSI Systems, vol. 11, No. 1, Feb. 2003, pp. 24-34.*

Chen et al., Improving Timing-Driven FPGA Packing with Physical Information, 2007 IEEE, pp. 117-123.*

Caldwell et al., "Improved Algorithms for Hypergraph Bipartitioning," 2000 IEEE, pp. 661-666.*

Bozorgzadeh et al., "RPack: Routability-Driven packing for cluster-based FPGAs," 2001 IEEE, pp. 629-634.*

Betz, Vaughn, et al., "Architecture and CAD for Deep-Submicron FPGAs," Kluwer Academic Publishers, 1999, 5 pages.

Karypis, George, et al., "Multilevel k-Way Hypergraph Partitioning," Department of Computer Science & Engineering, Army HPC Research Center, University of Minnesota, Technical Report # 98-036, 15 pages.

Marquardt, Alexander, et al., "Using Cluster-Based Logic Blocks and Timing-Driven Packing to Improve FPGA Speed and Density," Department of Electrical and Computer Engineering, Unviersity of Toronto, 10 pages.

* cited by examiner

METHOD FOR EFFICIENT FPGA PACKING

CROSS-REFERENCE TO RELATED APPLICATIONS

This application claims priority to U.S. Provisional Patent Application No. 61/844,524 filed Jul. 10, 2013 which is hereby incorporated by reference in its entirety.

BACKGROUND

Field of the Invention

The present invention relates to programmable integrated circuit technology, and specifically to cluster-based filed programmable gate array (FPGA) architecture and to programming cluster-based FPGA devices.

A cluster-based FPGA is made of an array of repeating clusters. A typical cluster is shown in FIG. 1B to be described further below. A BLE (basic logic element) is composed of a LUT (look up table) and a FF (flip-flop) as shown in FIG. 1A. A cluster (or CLB, configuration logic block) is composed of multiple BLEs. An FPGA array is composed of multiple such CLBs.

In the CAD (computer aided design) flow for cluster-based FPGA architecture, packing is a critical step and has significant impact on the final area efficiency of the device layout and/or performance of the device. This step groups logic elements in a netlist into clusters and significantly reduces the problem size for the time-consuming placement and routing steps.

FIG. 1A is a block diagram that shows a simple BLE 1 with one LUT 2, as described above, having inputs 3 and output 4 coupled to a single flip flop 5 having a clock input clk (reference numeral 6) as its only control signal. Multiplexer 7 selects between the output of the LUT 2 and the output of flip flop 5. The output of the BLE 1 is the output of the multiplexer 7. This is typical of FPGA architectures employed in research, like the architecture popularized by VPR (versatile place and route) software. In reality, the logic element can contain types other than just simple LUTs and flip flops (for example, multiplexers, carry logic and so on). Also, the BLE could be much more complicated: it could contain multiple LUTs, flip flops and/or multiplexers, the flip flops could have more complicated controls, carry chains, and so forth.

FIG. 1B is a block diagram that shows how a cluster 10 of BLE elements 4 are employed in a typical cluster-based FPGA architecture. Cluster 10 includes N BLE elements (1-1 through 1-N) and is coupled to a horizontal wiring channel 12 and a vertical wiring channel 14 each having multiple interconnect conductors 16, 18. Multiple conductors 16 from the horizontal wiring channel 12 and multiple conductors 18 from the vertical wiring channel 14 are coupled to an input interconnect block 16 that may be user configured to couple selected ones of conductors 16 and 18 to input conductors 18-1 through 18-N of BLE elements 1-1 through 1-N as well as selectively coupling outputs from BLE elements 1-1 through 1-N to selected interconnect conductors in the horizontal wiring channel 12 and the vertical wiring channel 14.

A user design is typically implemented in a register-transfer level (RTL) language like Verilog or VHDL. A synthesis tool will synthesize the design into a netlist of basic logic elements appropriate for implementation in the FPGA. Typically, these elements are LUTs and FFs. A packing tool takes a netlist and groups them into clusters. This step reduces the problem size significantly. Then placement and routing tools will implement the design in the FPGA device. The bit generation step will generate the corresponding bitmap file that defines the configuration of the FPGA. When programmed, the device will implement the user design.

FIG. 2 is a flow diagram that shows a typical CAD flow 30 for cluster-based FPGAs. The CAD flow starts at reference numeral 32. At reference numeral 34 a user design is input into the system. A user creates this design using RTL, for example, Verilog or VHDL. At reference numeral 36, the design is synthesized. A synthesis tool is used to synthesize the RTL to modules (LUTs/FFs) used in the target FPGA fabric. At reference numeral 38 a packer tool packs the modules into clusters in the FPGA. This process is needed for cluster based FPGA architectures. This process is referred to as "packing". At reference numeral 40 a placer tool places the packed design. The placer places the clusters on the FPGA device, typically optimizing total interconnect wire length, and delay. At reference numeral 42 a router tool generates the routing information. The router routes the interconnects using the pre-fabricated routing resource on the FPGA device. At reference numeral 44 the programming bitstream is generated corresponding to the placer/router results. At reference numeral 46 the configuration bitstream is outputted to the FPGA in order to program it. When programmed, the bit stream configures the logic/routing resources on the FPGA device to realize the user design.

Previous work has been done on optimizing FPGA packing. During packing, the tool needs to obey a set of constraints while at the same time attempting to optimize certain objectives. The common constraints are input bandwidth and flip flop related control constraints. An input bandwidth constraint is a limitation on the number of signals which can enter into a cluster (being driven by logic located outside of the cluster). Flip flop control constraints are limitations on the number of unique control signals (such as clocks, enables, and loads) which can be employed inside a cluster. The common optimization goals are reduction of the number of external input nets, absorbing timing critical connections (good for final timing), and absorbing high activity nets (good for power).

Most approaches are seed-based and work in a bottom-up fashion, which will now be described. The contents of each and every one of the publications are incorporated herein by reference. There have been several notable packing approaches. T-Vpack (see, e.g., V. Betz, J. Rose and A. Marquardt, *Architecture and CAD for Deep submicron FPGAs*, Kluwer Academic Publishers, February, 1999) was the first widely used packing tool for clustered logic blocks, and was released along with the academic VPR flow. T-VPack constructs each cluster in a sequential manner. First an initial seed BLE is chosen. Then, additional BLEs are added into the cluster according to an attraction cost function. The cluster is "sealed" once it is full, and another BLE is selected as the seed for a new cluster. This process is repeated until all BLEs are packed. The criteria for selecting the initial seed and the attraction cost function are based on both criticality and connectivity.

iRAC (see, e.g., A. Singh and M. Marek-Sadowska, *Efficient circuit clustering for area and power reduction in FPGAs*, FPGA2002, pp. 59-66) is another seed-based packing tool with routability as its main optimization goal. Seed selection and attraction costs are calculated in a way to maximize the absorption of small nets. This approach avoids filling up clusters (as in T-VPack) by not exceeding the cluster's Rent characteristic. Numerical results show that iRAC can reduce the number of inter-cluster nets by 24.6% compared to T-VPack. Such a reduction is shown to greatly reduce routing wire-length, channel width and power consumption. However, the number of clusters increases by about 7.8% compared to T-VPack. Such an increase is not desirable especially for a highly-utilized device. No performance numbers were presented.

One very different packing approach is presented in Z. Marrakchi, H. Mrabet, and H. Mehrez, *Hierarchical FPGA clustering based on multilevel partitioning approach to improve routability and reduce power dissipation*, ReConfig2005, pp. 25-29, and it is based on mincut hypergraph partitioning. Circuit netlists are typically represented as hypergraphs, in which nodes represent logic elements in the netlist and edges represent the wires which connect them. A k-way partitioning of a hypergraph attempts to assign the vertices of the graph to k disjoint, nonempty partitions. The k-way partitioning problem typically seeks to minimize the sum of the weights of the hyperedges that span more than one partition (that is, to find the minimum cut, or "mincut"). When constraints, such as the balancing of vertex area between the partitions, are applied, the problem can become NP-hard.

Several approaches to the partitioning problem have been studied in the literature. Modern partitioning heuristics can discover near-optimal mincut solutions in roughly linear time. One commonly-used technique is based on the recursive application of the multi-level Fiduccia-Mattheyses bi-partitioning algorithm (see G. Karypis and V. Kumar, *Multi-level k-way hypergraph partitioning*, DAC1999, pp. 343-348); such a technique is known as a "recursive mincut bi-partitioner". Alternatively, some approaches seek to split vertices directly into k partitions without applying recursive bipartitioning (G. Karypis and V. Kumar supra; L. A. Sanchis, *Multiple-Way Network Partitioning, IEEE Transactions on Computers*, Volume 38, Issue 1, January 1989, pp. 62-81). These methods are referred to as "direct k-way partitioners".

In the technique described by Z. Marrakchi et al., two phases are applied to arrive at a packing solution: first, a k-way partitioner is called to partition the netlist into an initial set of clusters; then, a legalization process is used to fix or "adjust" the clusters. The legalization process needs to adjust oversized clusters, as well as clusters with more inputs than provided by the architecture. (It uses 2 N+2=18 inputs for cluster size 8.) It reported an 18.7% routing channel reduction and 2.6% performance gain. Although k-way partitioning is expected to produce a high quality initial solution, the legalization phase, especially the adjusting of input bandwidth constraints, can disturb the initial solution and degrade the quality of the final solution. The k-way partitioner used in this approach is a direct k-way partitioner as described in G. Karypis et al.

Most of the packing algorithms above are developed based on the VPR routing architecture which has a tight input bandwidth constraint. A top-down partitioning-based approach for clustering is not amenable to such an architecture, as stated in V. Betz et al.: "clustering has been extensively studied with spectral and labeling methods being popular. Many of these methods, however, cannot easily incorporate simultaneously constraints on the maximum number of inputs, the number of clocks, and the number of LUTs and registers in a logic block, and these constraints are key in logic block packing. Spectral methods use analytic techniques to produce natural groupings of circuit elements and then enforce constraints on cluster size etc. in a post-processing step. With many cluster legality constraints, then it becomes likely that this post-processing step will perturb the natural clustering solutions enough to significantly impact the results quality."

Top-down partitioning approaches appear particularly attractive to FPGA architectures without input bandwidth constraints, like Microsemi's SmartFusion2 described in J. Greene, et al., "A 65 nm flash based FPGA fabric optimized for low cost and power", FPGA2011, pp. 87-96, or architectures described in U.S. Pat. No. 7,545,169 to W. Feng and S. Kaptanoglu, entitled "FPGA architecture having two-level cluster input interconnect scheme without input bandwidth constraint", since the primary constraint is on the cluster size and flip flop controls and this is relatively easy to resolve. This behavior has been demonstrated in W. Feng, FPT 2012, pp. 8-15.

In the past, it had been assumed that to improve routability, the goal at the packing stage should be to minimize the number of external signals, or equivalently, maximize the number of signals that can be absorbed in the clusters. The reasoning behind such an assumption is that an absorbed signal can be routed inside the cluster and does not need to use any external routing resources. This approach has been shown to produce good results and has been used by many previous works, including W. Feng, supra. However, it is not known whether the goal of minimizing the number of external signals is equivalent to optimizing routability. Below, theoretical arguments are given to demonstrate that such approaches (based on minimizing the number of external signals) are likely to be sub-optimal.

The Rent characteristic of a netlist is the relation between the number of external terminals of a given subcircuit with the number of modules in the subcircuit. For a subcircuit with G modules, the number of external terminals T can be characterized by the following power law form:

$$T = tG^p \qquad \text{Eq.(1)}$$

where t is the number of terminals of a basic module of the subcircuit, and exponent p is a number between 0 to 1, called the Rent exponent. The higher the p, the more complicated the design. It has been experimentally observed and theoretically proven that a higher p (with the same t) corresponds to a higher routing requirement after layout.

The power-law form is a very simplified and idealistic form and may not be enough to describe real circuits. In the general case, the relation can be characterized by the following:

$$T = R(G) \qquad \text{Eq.(2)}$$

and this is known as the Rent characteristic. For two netlists with different Rent characteristic relations R1( ) and R2( ) if R1(G)>=R2(G) for all values of G, then it is reasonable to assume that the netlist with R1( ) will have higher routing requirement than the one with R2( ) due to its more complicated interconnect nature, just as a higher Rent exponent would indicate in the simple case. For example, in FIG. 3, three Rent characteristic curves are shown: the solid curve is R1( ), the dotted curve is R2( ), and the dashed curve is R3( ). It should be expected that both R2( ) and R3( ) would have higher routing requirement than R1( ).

BRIEF DESCRIPTION

The present invention relates to a packing approach that achieves improved routability responsive to improving the Rent characteristics of the cluster level netlist.

BRIEF DESCRIPTION OF THE DRAWING FIGURES

DETAILED DESCRIPTION

Figure 1A:
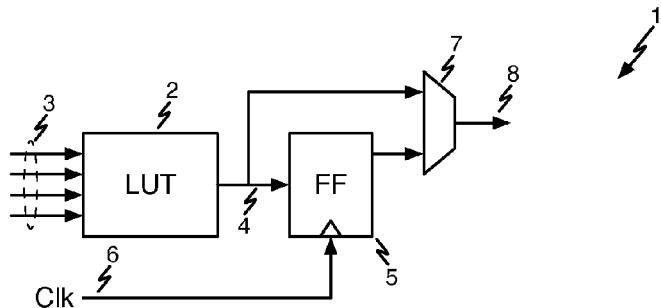
FIG. 1A is a block diagram that shows a simple basic logic element (BLE) with one lookup table (LUT) and one flip flop having a clock signal clk as its only control signal.
Figure 1B:
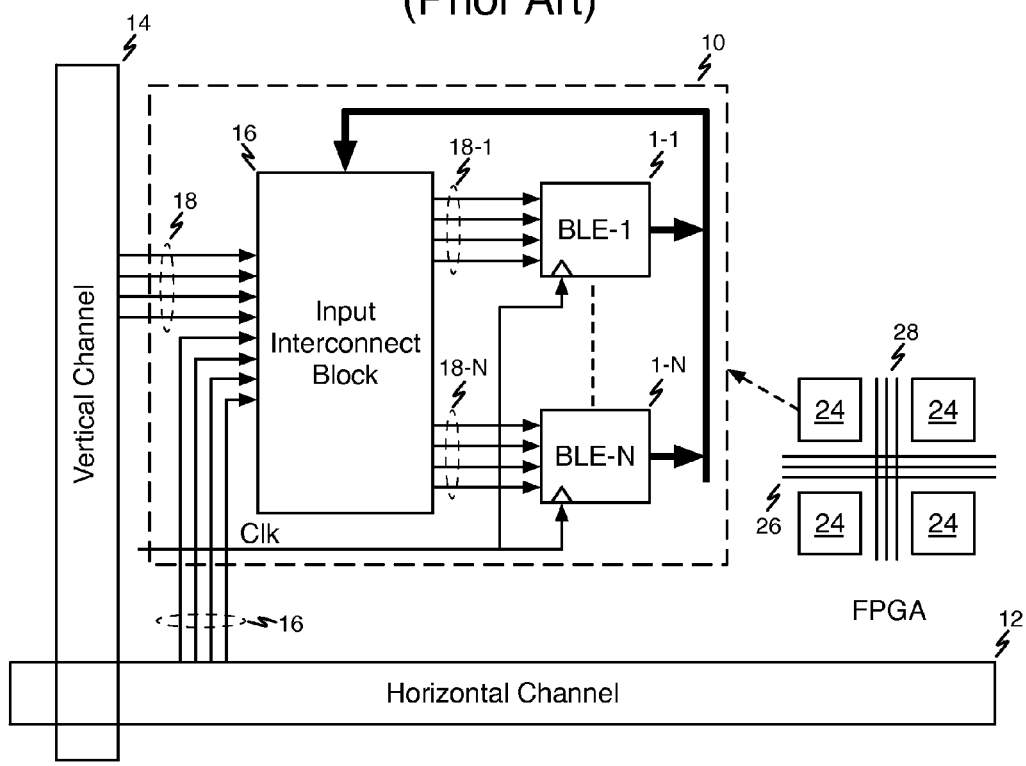
FIG. 1B is a block diagram showing a configuration logic block (CLB) in a clustered FPGA array.

Persons of ordinary skill in the art will realize that the following description of the present invention is illustrative only and not in any way limiting. Other embodiments of the invention will readily suggest themselves to such skilled persons.

The present invention may be referred to as partitioning-based packing. It is a technique for packing logic in a clustered architecture based on recursive partitioning. The present invention replaces the functions performed at reference numeral 38 in FIG. 2.

Figures 2, 4:
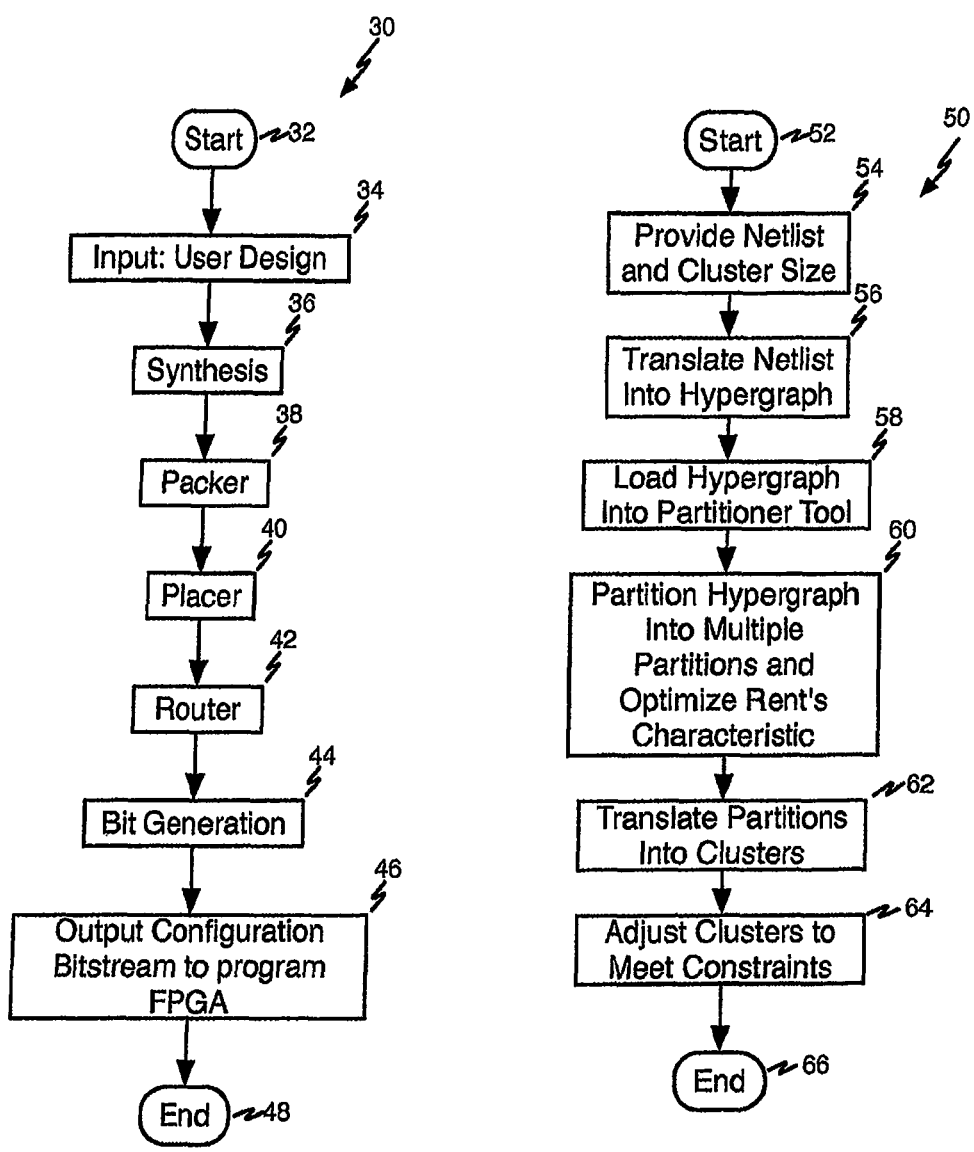
FIG. 2 is a flow diagram illustrating a typical computer aided design (CAD) process flow for cluster based FPGA devices.
FIG. 4 is a flow diagram illustrating a technique for packing logic in a clustered architecture based on recursive partitioning in accordance with the present invention.

Referring now to FIG. 4, a flow diagram illustrates an example of partitioning-based packing in accordance with the present invention. A partitioning-based packing process 50 according to the present invention begins at reference numeral 52. At reference numeral 54 a netlist including a desired cluster size is specified. This information can be provided by the functions performed in reference numerals 34 and 36 of the process shown in FIG. 4.

At reference numeral 56 the netlist is translated into a hypergraph. A hypergraph is a generalization of a graph in which an edge can connect any number of vertices. When a user netlist is translated into a graph, with LUT/FFs becoming vertices and connections between LUT/FFs becoming edges, it will be a hypergraph due to the multiple fanout nature in the user netlist.

At reference numeral 58 the hypergraph is loaded into a partitioner tool. Partitioner tools are well known in the prior art. The most commonly known partitioner toll is a min-cut bipartition tool. At reference numeral 60 the partitioner tool partitions the hypergraph into multiple partitions and improves the Rent characteristic for the partition solution. At reference numeral 62 the partitions are translated into clusters. At reference numeral 64 the clusters are adjusted to meet design constraints including cluster size constraints, control signal constraints, module packing constraints, region constraints, and so forth. The process ends at reference numeral 66.

Instead of optimizing for min-cut between k components, the partitions are generally optimized for the Rent characteristic, i.e. as described above in relation to EQ. 2, T is generally minimized for each subcircuit having G modules. The approach of the present invention typically has more cuts than prior-art approaches optimized for cut minimization. The term optimized as used herein is not meant to be an absolute term, but instead is meant in the general meaning of improvement due to focus on the particular characteristic, in this case the Rent characteristic. An example of such optimization is shown in the curve R1( ) of FIG. 3, which has an overall Rent characteristic that is better than the Rent characteristic exhibited in curves R2( ) and R3( ).

Figure 5:
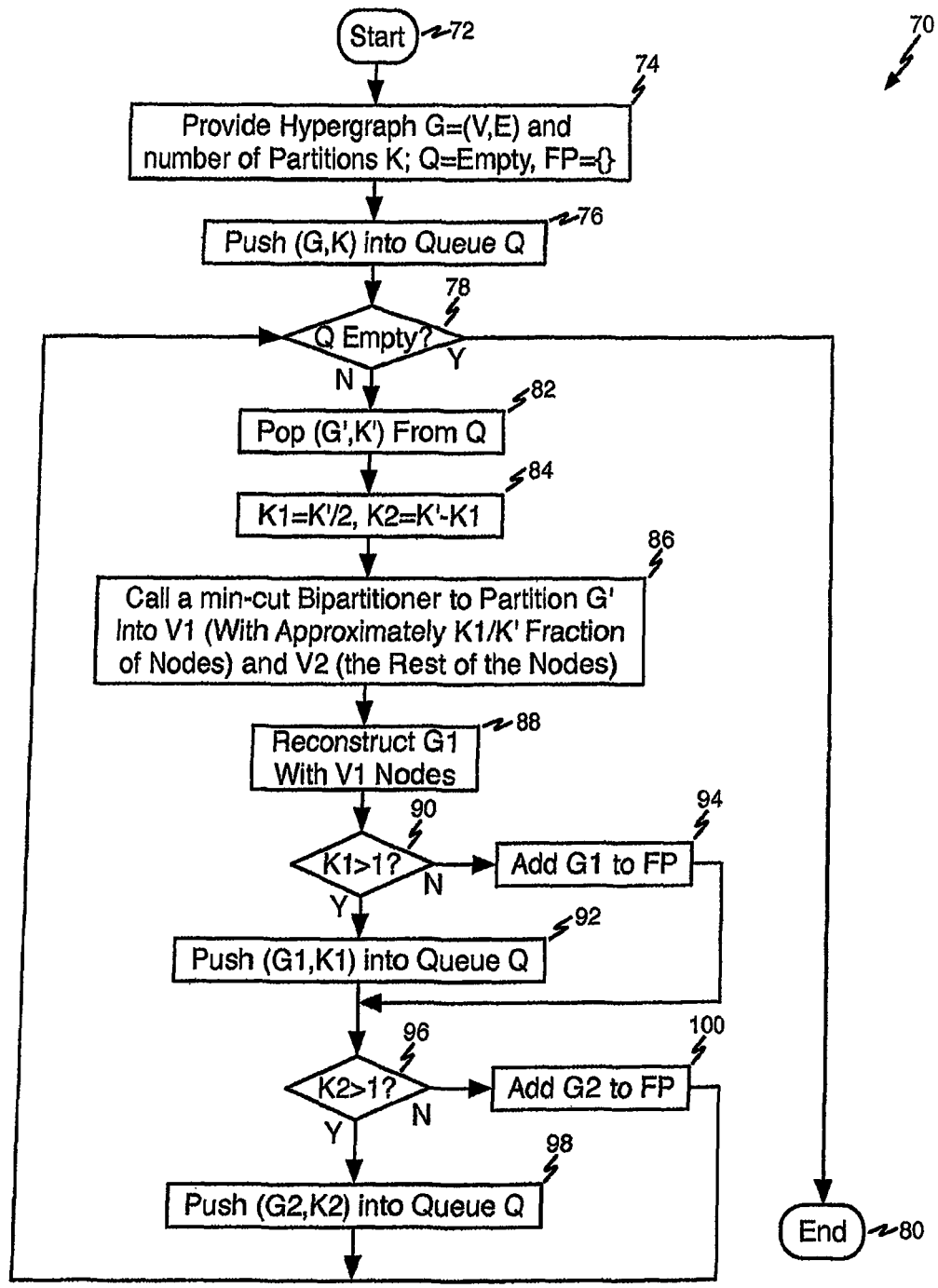
FIG. 5 is a flow diagram illustrating a recursive bipartitioner-based k-way partitioner in accordance with the present invention.

Referring now to FIG. 5, a flow diagram shows an illustrative partitioning scheme 70. According to the present invention, a k-way partitioner divides the vertex set into k smaller components. The process begins at reference numeral 72. At reference numeral 74, a hypergraph G=(V,E) where V is a set of nodes representing a logic module and E represents the connections between the nodes, and K is number of partitions. A queue Q of partition instances is set to empty. Persons of ordinary skill in the art will appreciate that other containers such as stacks could be in place of a queue. A set of final partitions (FP) is defined. The set is empty when the process starts, and contains the set of final K partitions when the process ends. A good partition is defined as one in which the number of edges (i.e., cut) running between separated components is minimized.

At reference numeral 76, a partition instance (G,K) is pushed into the queue. At reference numeral 78 it is determined if the queue is empty. If the queue is empty, the process ends at reference numeral 80. Persons of ordinary skill in the art will appreciate that because of the action at reference numeral 76, the queue will not be empty the first time through this decision process.

If, at reference numeral 78 it is determined that the queue is not empty, the process proceeds to reference numeral 82, where an instance (G',K') is popped from the queue Q. At reference numeral 84, K' is separated into two parts, K1= (floor)K'/2, and K2=K'−K1. At reference numeral 86, a min-cut bipartitioner is called to partition G' into V1 (with approximately K1/K' fraction of nodes) and V2 (the rest of the nodes). At reference numeral 88, G1 is reconstructed having V1 nodes.

At reference numeral 90 it is determined whether K1 is greater than 1. If K1 is greater than 1, the process proceeds to reference numeral 92 where a new partition instance (G1, K1) is pushed into the queue. If at reference numeral 90 it is determined that K1 is not greater than 1, then K1 is equal to one it meaning that G1 is a final partition and needs no further processing so the process proceeds to reference numeral 94 where G1 is added to FP.

After performance of the process at either reference numeral 92 or reference numeral 94, the process proceeds to reference numeral 96, where it is determined whether K2 is greater than 1. If K2 is greater than 1, the process proceeds to reference numeral 96 where (G2, K2) is pushed into the queue. If at reference numeral 96 it is determined that K2 is not greater than 1, then K2 is equal to 1 meaning that G2 is a final partition and needs no further processing so the process proceeds to reference numeral 100 where G2 is added to FP. After performance of the process at either reference numeral 98 or reference numeral 100, the process loops again to reference numeral 78. This loop is continued until the queue (or other storage) is empty.

The approach of the present invention works best for architectures without many cluster constraints, such that only small amount of cluster adjusting work is needed after the initial partitions are produced. The invention described herein works especially well for architectures without an input bandwidth constraint or with a very relaxed input bandwidth constraint such that the constraint can be ignored most of the time.

One difference between the present invention and some of the prior-art approaches discussed herein is that a recursive bipartitioner is used to obtain k-way partitions, where the k-way partitions are used to reconstruct the desired logic clusters to implement in the FPGA device. The k-way partitioning approach of the present invention based on recursive bipartitioning is shown below. By generating the partitions in this way, the Rent characteristic of the cluster-level netlist can be generally improved, thus improving routability and resulting in lower routing requirements. The bipartitioner should optimize for minimizing cuts between the two partitions subject to balance constraints.

Figure 6:
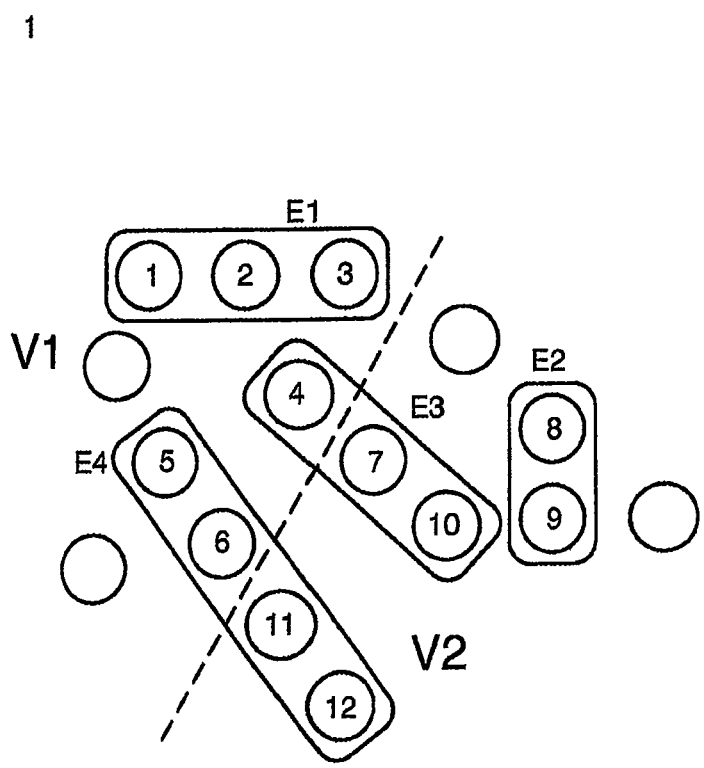
FIG. 6 is a diagram illustrating reconstructing edges in subgraphs in accordance with the present invention.

Referring now to FIG. 6, a diagram illustrates an example of one aspect of the approach of the present invention relating to how sub graph G1 and G2 are constructed after the bipartitioning of G. The nodes from 1 to 6 are in V1 and nodes from 7 to 12 are in V2 after bipartitioning. The dashed line represents the cut line. For the four hyper edges E1-E4 in the graph, E1 is reconstructed in G1, E2 is reconstructed in G2, E3 is reconstructed only in G2 with nodes 7 and 10. The other node 4 of the edge is in G1 and is ignored. E4 is reconstructed in both G1 and G2. In G1, it is an edge with nodes 5 and 6; and in G2, it is an edge with nodes 11 and 12.

The way these edges are reconstructed is important in minimizing the external nets for the partitions in the ensuing bipartitions. This is consistent to improve the Rent characteristic of the final k-way partition solution. The other approach commonly used (for overall cut minimization) ignores all edges being cut in G' during the reconstruction of G1 and G2. When applied to the example, edge E3 and E4 would not be reconstructed in either G1 or G2. As a result, during the ensuing partition of G2, since there is no edge between nodes 7 and 10 (or 11 and 12), they are more likely to be put into different partitions. This in general would result in more external nets for the ensuing partitions.

In one variation, a recursive k-way partitioner with small k (like 3 or 4) is used instead of a recursive bipartitioner and can achieve a similar effect as well. In contrast, the direct k-way partitioner approach does not rely on a bipartitioner and could produce k partitions with smaller cut, but it does not necessarily optimize the Rent characteristic of the partitioned solution.

Unless a perfect k-way partitioning (in terms of obeying various constraints) is achieved, an additional process (shown at reference numeral 64 in FIG. 4) is usually required to ensure that all clusters are legal (that is, that they obey all cluster constraints). These constraints include cluster size constraints, control signal constraints, module packing constraints, region constraints, and so forth. One method by which this can be accomplished is detailed in Z. Marrakchi et al., referenced above, wherein cells in the illegal clusters are iteratively removed (until the clusters are rendered legal) and the removed cells are then either placed into their own clusters or merged into other clusters without violating the defined constraints. Further strategies for adjusting illegal clusters can include: (1) Monte-Carlo methods for permuting cells between clusters subject to optimization goals and cluster constraints; (2) Branch & Bound, ILP, or SAT-based strategies which split illegal clusters into legal solutions while optimizing objectives and minimizing the perturbation to the cut objective.

One advantage offered by the approach of the present invention is that it achieves a significant improvement in routability over previous approaches by generally optimizing the Rent characteristic of the clustered netlist. By performing the packing in a top-down fashion using recursive bipartitions while (at every step) minimizing the number of external nets, the packing solution of the present invention achieves a better Rent characteristic than can be achieved using seed-based approaches, which work in a bottom-up fashion and do not employ the Rent characteristic as their optimization goal. The approach of the present invention will also outperform the direct k-way partitioner based approach because the direct k-way partitioner does not focus on optimization of the Rent characteristic, as it generates all k partitions simultaneously. The recursive min-cut bipartitioning flow intrinsically improves the Rent characteristic by repeatedly minimizing the number of edges cuts between partitions at each level of the partitioning problem. This, in turn, approximates the problem of globally minimizing all external degrees, which leads to a better Rent characteristic than what can be achieved using traditional k-way partitioning. An additional advantage of recursive min-cut bipartitioning is that it is comparatively much faster than k-way partitioning, providing a benefit not only in terms of solution quality but also in terms of algorithm runtime.

Figure 3:
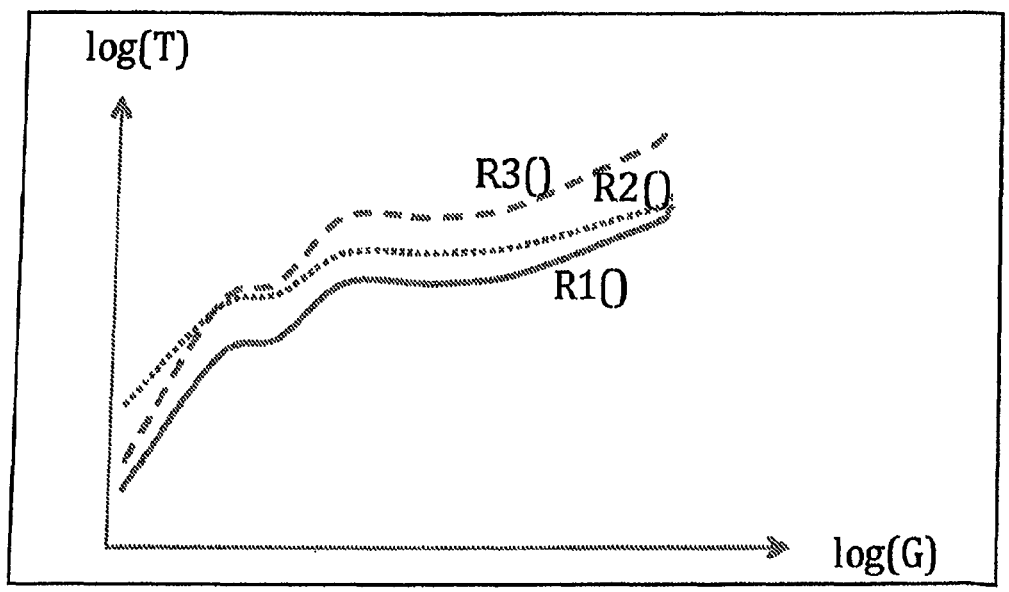
FIG. 3 is a graph showing three Rent characteristic curves.

Compared to solutions produced by seed-based or direct k-way partitioning-based approaches, the Rent characteristic of the present invention is superior (as shown in curve R1( ) of FIG. 3), while the other approaches produce characteristic curves like R2( ) or R3( ).

Further improvement with a slightly loose packing can be achieved in accordance with the present invention. Providing a "loose" packing, wherein slightly more clusters than minimal are allowed to be produced, usually can help to reduce the amount of work needed in the cluster adjusting step. This can reduce the disturbance to the initial partitions, resulting in a better Rent characteristic for the final solution.

The approach of the present invention can be made timing-driven if the critical edges in the design can be collected (via timing analysis) and put, as weighted edges, into the partition graph. These additional edges encourage the partitioner to produce a solution which can keep timing-critical connections together with only minor deviations from the formulation of the original graph (which is purely based on connectivity). As a result, the effect on routability is usually small while the timing improvement is large.

The approach of the present invention can be applied to architectures having bandwidth constraints. Applying the approach of the present invention directly to an architecture with input bandwidth constraint would typically entail more work in the cluster adjusting process. This is because, in general, the partitioning process cannot take into account the input bandwidth of the final partitions. As a result, it can produce partitions which exceed the input bandwidth constraint. One way to get around this issue is to underutilize the clusters (for example, for a cluster of size 12 BLEs, one could specify a limit of 10 BLEs during partitioning). This will reduce the number of inputs needed per cluster due to smaller partition size and provide less chance for a cluster to exceed the input bandwidth limit. However, this approach will generally have a negative impact on utilization.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:
1. A method for programming a cluster-based field programmable gate array (FPGA) device comprising:
   providing a netlist and cluster size information;
   translating the netlist into a hypergraph;
   recursively partitioning the hypergraph into multiple partitions, each partition having a size not exceeding the cluster size;
   translating the partitions into clusters;
   placing the clusters on the FPGA device;
   routing interconnects using a pre-fabricated routing resource on the FPGA device;
   generating a programming bitstream in response to the placing and routing; and providing the programming bitstream to the FPGA device to realize the user design.

2. The method of claim 1 wherein recursively partitioning the hypergraph into multiple partitions comprises recursively k-way partitioning the hypergraph into multiple partitions.

3. The method of claim 2 wherein recursively k-way partitioning the hypergraph into multiple partitions comprises recursively bi-partitioning the hypergraph into multiple partitions.

4. The method of claim 1 including, after translating the partitions into clusters, adjusting the clusters to meet at least one design constraint.

5. The method of claim 4 wherein adjusting the clusters to meet at least one design constraint comprises adjusting the clusters to meet at least one of a cluster size constraint, a control signal constraint, a module packing constraint, and a region constraint.

* * * * *